United States Patent
Farooq et al.

(10) Patent No.: US 9,536,784 B1
(45) Date of Patent: Jan. 3, 2017

(54) INTEGRATED CIRCUIT (IC) CHIPS WITH THROUGH SILICON VIAS (TSV) AND METHOD OF FORMING THE IC

(71) Applicant: GLOBALFOUNDRIES Inc., Grand Cayman (KY)

(72) Inventors: Mukta G. Farooq, Hopewell Junction, NY (US); Andrew J. Martin, Carmel, NY (US); Jennifer A. Oakley, Poughkeepsie, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/749,843

(22) Filed: Jun. 25, 2015

(51) Int. Cl.
*H01L 21/78* (2006.01)
*H01L 21/00* (2006.01)
*H01L 21/768* (2006.01)
*H01L 23/48* (2006.01)

(52) U.S. Cl.
CPC ....... *H01L 21/76898* (2013.01); *H01L 23/481* (2013.01)

(58) Field of Classification Search
CPC .. H01L 21/768; H01L 21/76877; H01L 21/00; H01L 21/31; H01L 21/44; H01L 21/306; H01L 21/3213; H01L 21/56; H01L 21/78; H01L 21/304; H01L 21/786; H01L 21/76802; H01L 21/76843; H01L 21/31144; H01L 21/31116; H01L 21/76807; H01L 21/762; H01L 21/76898

USPC .................. 257/621; 438/637, 667
See application file for complete search history.

(56) References Cited

U.S. PATENT DOCUMENTS

| | | | |
|---|---|---|---|
| 6,303,413 B1* | 10/2001 | Kalnitsky | H01L 21/76264 257/E21.564 |
| 8,703,609 B2 | 4/2014 | Kuo et al. | |
| 2009/0051039 A1 | 2/2009 | Kuo et al. | |
| 2011/0198721 A1* | 8/2011 | Yang | H01L 21/76898 257/506 |
| 2012/0193808 A1* | 8/2012 | Zou | B81C 3/001 257/774 |
| 2013/0154051 A1 | 6/2013 | Tournier et al. | |
| 2014/0021631 A1* | 1/2014 | Tsumura | H01L 23/49827 257/774 |

* cited by examiner

*Primary Examiner* — Chuong A Luu
(74) *Attorney, Agent, or Firm* — Robert Curcio; DeLio, Peterson & Curcio, LLC

(57) ABSTRACT

A method of forming through silicon vias (TSVs) on integrated circuit (IC) chips and the IC chips. A TSV pattern on a stack of wiring layers on the surface of the IC chip identifies TSV locations. Etching the IC chip TSV pattern opens a cup shaped through hole through the stack to the silicon substrate at each TSV pattern location. The etched stack forms a TSV hard mask open (HMO) for the silicon substrate. Via through holes etched through the silicon substrate masked by the HMO are filled with conductor connecting IC circuits, e.g., to signal lines on the bottom of the chip.

17 Claims, 4 Drawing Sheets

INTEGRATED CIRCUIT (IC) CHIPS WITH THROUGH SILICON VIAS (TSV) AND METHOD OF FORMING THE IC

BACKGROUND OF THE INVENTION

Field of the Invention

The present invention is related to manufacturing Integrated Circuit (IC) chips, and more particularly, to forming through silicon vias (TSV) in IC chips.

Background Description

Through silicon vias (TSV) are used for a number of Integrated Circuit (IC) chip applications. Typically, TSVs are formed by etching vias through the chip and filling the vias with metal after chip circuits and wiring are nearly complete. TSV etching requires etching vias completely through a stack of back end of line (BEOL) layers to the silicon (Si) chip surface, sometimes considered or called a hard mask open (HMO), followed by a silicon specific reactive ion etch (RIE) to etch into and through the Si substrate.

If the HMO via pattern is insufficiently opened, then a dielectric film residue remains at the bottom of the vias. This dielectric film residue acts as an etch mask at the bottom of the vias, inhibiting complete Si removal. In particular, the dielectric film residual can compromise TSV integrity causing mis-formed TSVs, e.g., during a TSV copper fill step. Mis-formed and/or shallow TSVs can be mis-shapen and lead to what is known as TSV "pistoning" when copper is annealed to form the TSVs. In particular, pistoning occurs when the metal (e.g., Cu) filled into a misformed and/or improperly filled TSVs (e.g., containing voids) shifts due to subsequent thermal processing, which often pushes upward, fracturing overlying films. Also, etching typically is not uniform across a chip or wafer. For example, the HMO via pattern may open completely towards the center of a chip, with varying levels of residue remaining in the vias around the periphery. In some cases across the chip etch depth variability may be as much as one micron (~2%) from center-to-edge. These mis-formed TSVs and TSV variability has degraded chip yield significantly.

One approach to eliminating residue extends the HMO into the silicon, e.g., etching longer. In this approach, opening the HMO may consume significant additional resist to guarantee fully etching into the Si for edge TSVs that normally under etch. This additional resist consumption can prevent further processing, i.e., Si RIE, that may be necessary to make long extensions into the silicon. Complete removal of the resist carries the risk of etching through top field dielectric layers and copper, wires and/or vias, which would have detrimental effects on the etch chamber.

Thus, there is a need for well-formed TSVs, and more particularly, for forming a clean HMO via pattern without residual dielectric material remaining on silicon at the via bottom in the open vias.

SUMMARY OF THE INVENTION

In an aspect of embodiments of the invention Integrated Circuit (IC) chip fabrication yield is improved;

In another aspect of embodiments of the invention through silicon via (TSV) defects are minimized in IC chips;

In yet another aspect of embodiments of the invention IC chip TSV pistoning is minimized;

In yet another aspect of embodiments of the invention IC chip TSV are uniformly produced to minimize TSV defects for improved IC chip yield.

Embodiments of the invention relate to a method of forming through silicon vias (TSVs) on integrated circuit (IC) chips and the IC chips. A TSV pattern on a stack of wiring layers on the surface of the IC chip identifies TSV locations. Etching the IC chip TSV pattern opens a cup shaped through hole through the stack to the silicon substrate at each TSV pattern location. The etched stack forms a TSV hard mask open (HMO) for the silicon substrate. Via through holes etched through the silicon substrate masked by the HMO are filled with conductor connecting IC circuits, e.g., to signal lines on the bottom of the chip.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
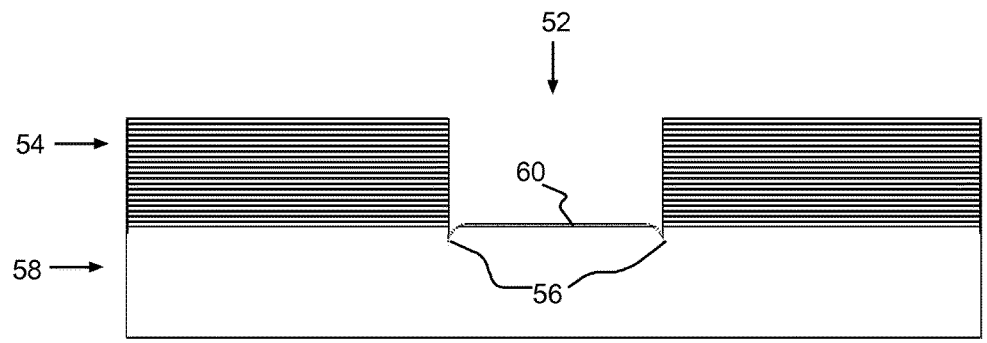
FIG. 1 shows an example of the cross section through an integrated circuit (IC) chip during through silicon via (TSV) formation, after hard mask open (HMO) definition using a prior definition step.

Turning now to the drawings and, more particularly, FIG. 1 shows an example of the cross section through an integrated circuit (IC) chip 50 during through silicon via (TSV) 52 formation, after hard mask open (HMO) 54 definition using a prior definition step. As is apparent from this example, although etching has removed all of the dielectric at the HMO via periphery 56 and extended into silicon 58, an unwanted dielectric cap or blister 60 remains in the center of the HMO via. When the underlying silicon is etched and filled with metal, e.g., copper (Cu), the HMO blisters 60 tend to cause TSV through holes to misform due to incomplete etching at the bottoms of the BEOL stack during HMO. The misformed through holes can lead to Cu voiding in the silicon 58, which may cause pistoning after high temperature copper anneal, which causes film delamination. These, TSVs defects all reduce chip manufacturing yield.

Figure 2:
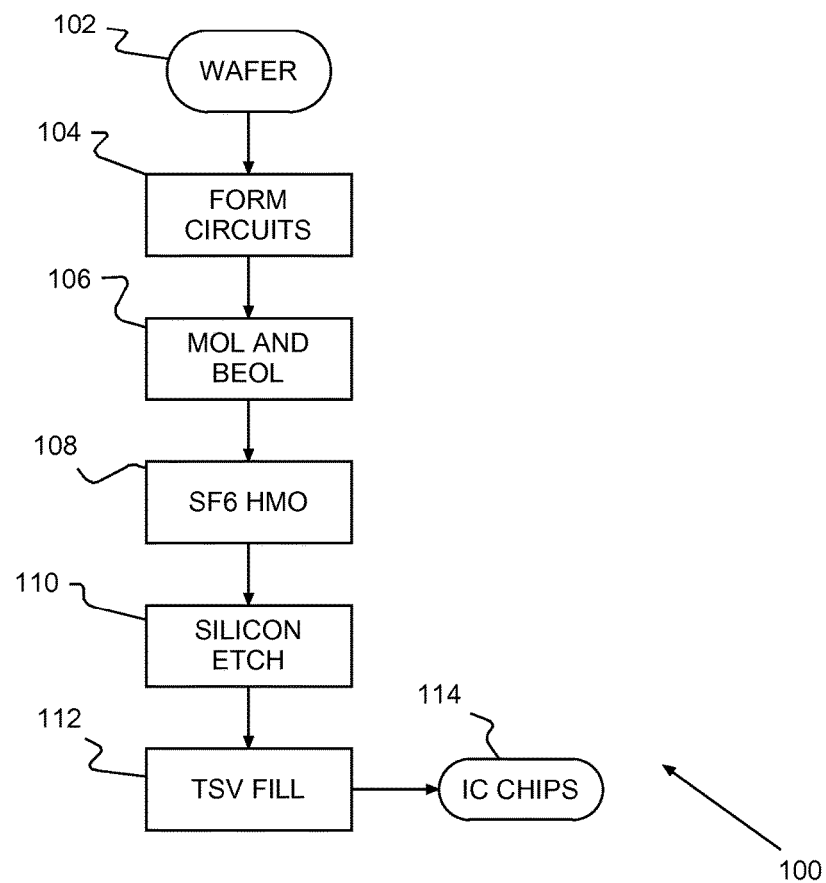
FIG. 2 shows an example of a preferred method of forming through silicon vias (TSV) in integrated circuit (IC) chips according to preferred embodiments of the invention.

FIG. 2 shows an example of a preferred method 100 of forming through silicon vias (TSV) in integrated circuit (IC) chips according to preferred embodiments of the invention. Fabrication begins in step 102 with providing a typical silicon wafer. In step 104 chip circuits are defined on the silicon wafer. In step 106 chip processing continues through normal middle of the line (MOL) and back end of the line (BEOL) steps. After BEOL, a TSVs are formed in a two-step TSV etch, a preferred dielectric etch (hard mask open) 108 through all BEOL layers, followed by silicon Bosch etch 110. Resulting through vias may exhibit a stair-step profile with a step at the HMO-silicon transition.

Then, in step 112, the metal TSVs are formed. It should be noted that although described herein for through hole vias, the present invention has application to forming so-called "blind" vias, where connection to the via end is made after formation. Once metal TSVs are complete, chip manufacturing continues 114 normally, e.g., forming a final metal layer above the TSV layer connecting the TSVs to chip circuits there beneath, passivating and dicing the completed chips.

Figure 3:
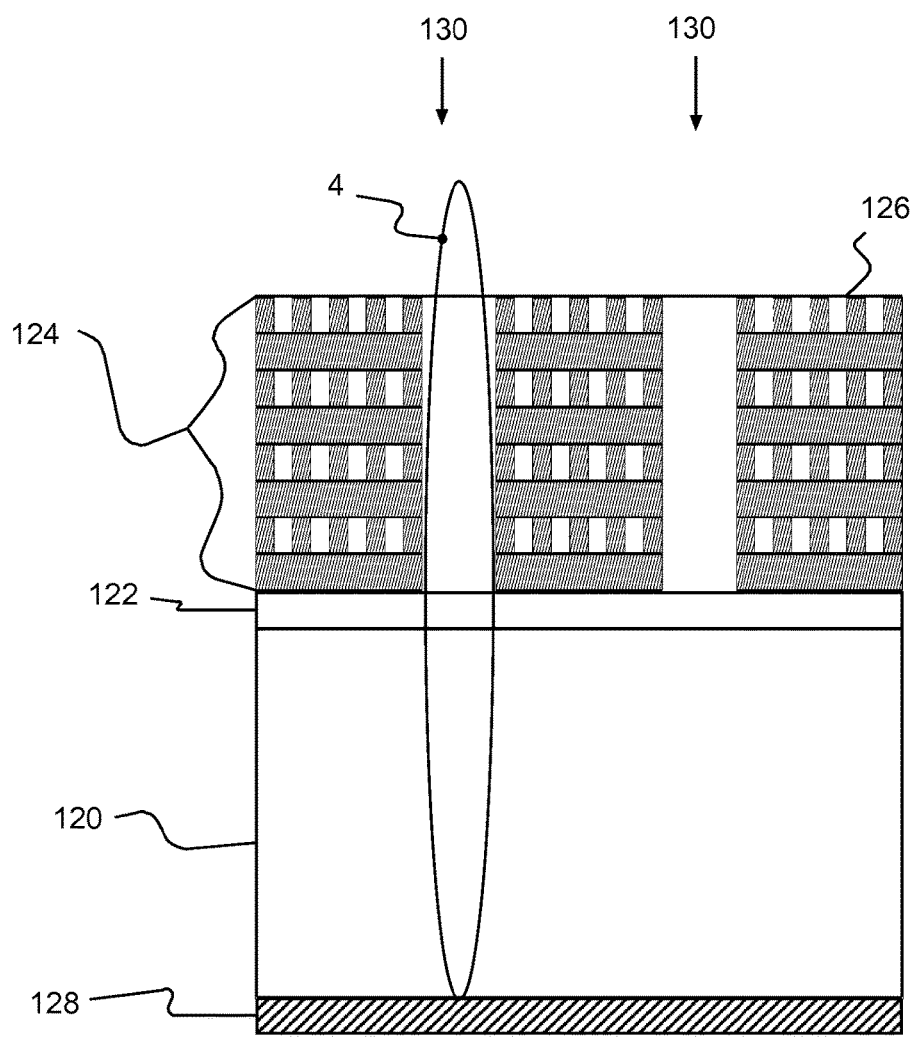
FIG. 3 shows a simple example of a silicon wafer with circuits on a circuit layer connected in MOL and BEOL layers.

FIG. 3 shows a simple example of a silicon wafer 120 provided in step 102 of FIG. 2 with a circuit layer 122 with circuits formed in step 104 and after MOL and BEOL layers 124 in step 106. TSVs are to be formed at multiple locations, e.g., at 130, between the upper surface 126 to land on bottom metal 128, e.g., off-chip signal pads. Wiring in the BEOL layers 124 may be oriented orthogonally to each other, e.g., oriented in the layer x-direction on one layer and the layer y-direction next layer (i.e., above or superimposed layer). Contact or via layers (not shown) between wiring layers connect each layer to the layer above and/or below. Typically, the wiring in the BEOL layers 124 is a suitable metal separated by a suitable dielectric, typically oxide ($SiO_2$). Thus, clear paths 130 are reserved through the wiring layers for TSV formation, and vias are formed by a deep oxide etch followed by a deep silicon etch.

Figure 4A:
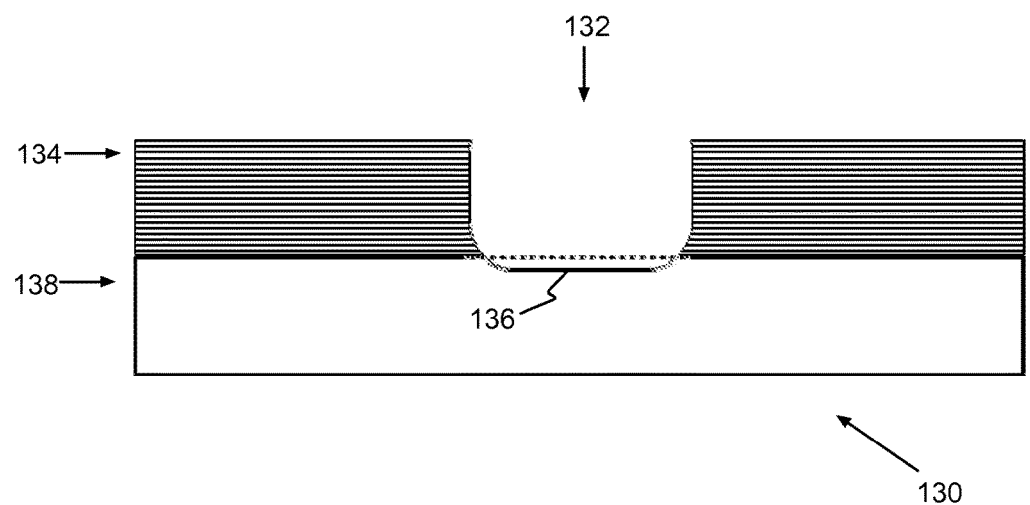
FIGS. 4A-B show an example of the two-step TSV etch to form TSV in a clear path through the wafer in an enlarged cross sectional example of area 4 in FIG. 2.
Figure 4B:
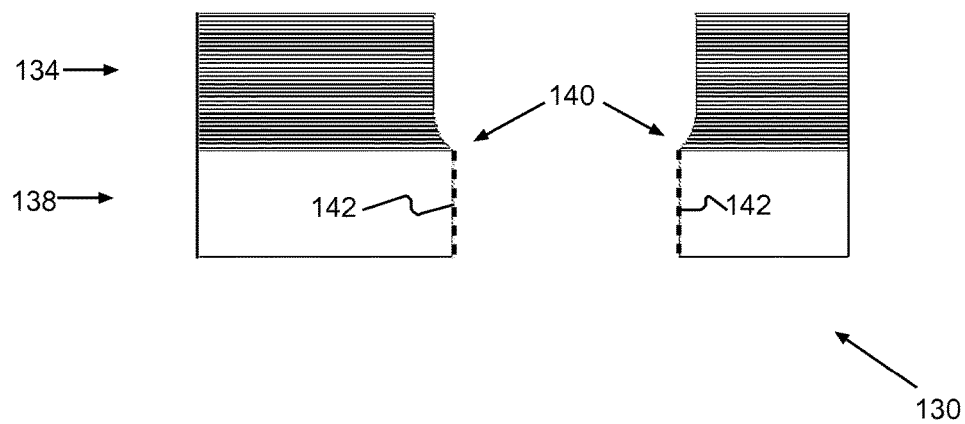

The exploded cross sectional example of area 4 in FIG. 3 shown in FIGS. 4A-B shows an example of the two-step TSV etch to form TSV in a clear path 130 through the wafer 120. Preferably, a simple mask pattern (not shown) is formed on the wafer surface 126, e.g., using a typical photolithographic mask. In step 108 through holes 132 are formed to define the HMO 134 in the BEOL layers. Preferably, a plasma etch etches the BEOL (oxide) layers using a Nitrogen trifluoride ($NF_3$) as a primary etchant. The Nitrogen trifluoride etches slightly more dielectric from the center than at the periphery of the via through holes 132. Optionally, at this point the photolithographic via mask may be removed from the surface 126.

Thus, via through holes 132 patterned through the BEOL layers have concave or cup-shaped bottoms 136. HMO etching continues to, and at least partially into, the silicon wafer 138 preferably 0.5 microns (0.5 μm) into the silicon 138. Preferably, the resulting cup-shaped through holes 132 are deepest at the center bottom, with through holes 132 depth decreasing radially outward toward the TSV sidewalls. Moreover, the shallowest areas of each cup shaped through hole is towards the periphery and rounded at the edges. Because the cup-shaped bottoms 136 extend below the HMO 134 BEOL layers 124, the subsequently completed through-hole bottoms are silicon and etch uniformly, i.e., without any dielectric material at the center which may act as a mask and create misformed TSVs.

In step 110 the underlying silicon wafer 138 is etched through the HMO 134 using a typical etchant to complete TSV through-holes. Preferably, a Bosch deep reactive ion etching (DRIE) is used to etch the silicon which exhibits a well-known effect of sidewall rippling, or so-called "scalloping." The HMO breakthrough forms a sidewall 140 discontinuity or "stair-step" 142 at the HMO to Bosch etch transition due to the concave or cup-shaped bottom resulting from the HMO etch chemistry. It should be noted that above the "stair-step" 142 TSV sidewalls 140 form relatively smooth, and below exhibit Bosch scalloping.

Figure 5:
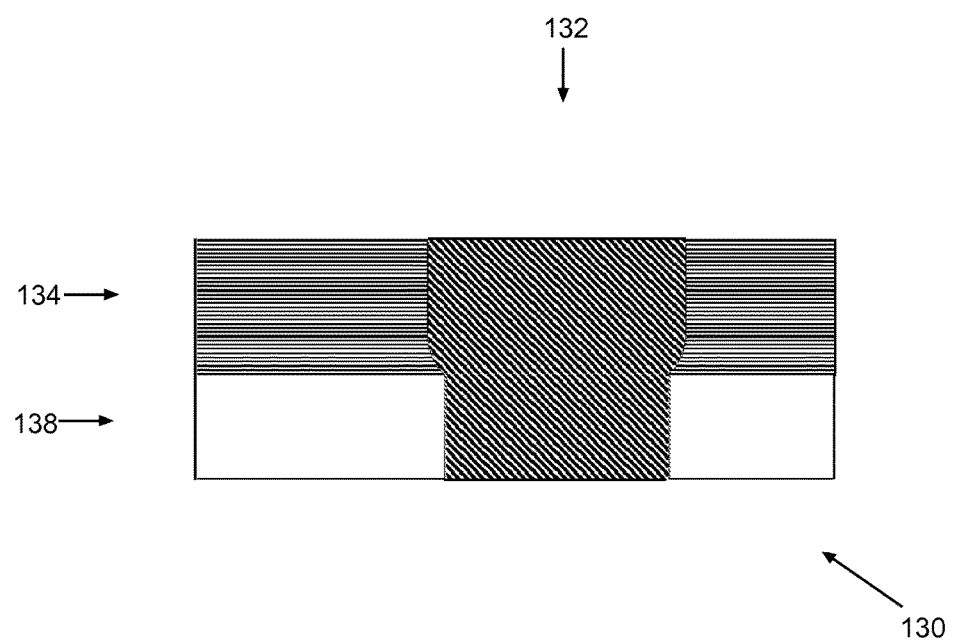
FIG. 5 shows an example of a TSV formed through the wafer.

FIG. 5 shows an example of a metal TSV 144 formed in step 112. A typical is formed by lining the TSV through hole with a suitable metal liner material to prevent chemical interaction between the TSV metal and the various chip layers through which the TSV passes. The liner is followed by depositing metal on the wafer and planarizing the metal to the chip surface. Preferably, the TSV metal is copper (Cu).

Advantageously, TSVs formed according to the preferred embodiments form more uniformly, across chip and across wafer. A preferred HMO has vias with a cup-shaped or concave structure that ends, in part or in whole, within the Si substrate. Thus, all HMO material is completely removed from via through holes prior to silicon etch for clean, complete vias. TSV pistoning is reduced and/or eliminated for clean, well formed vias across chip and across wafer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming through silicon vias (TSVs) on an integrated circuit (IC) chip wafer, said method comprising:
   forming a through silicon via (TSV) pattern identifying a plurality of TSV locations on the surface of an IC chip wafer, said IC chip wafer including one or more IC chip die, each IC die including a plurality of circuits on a silicon substrate and a stack of wiring layers on said silicon substrate above said plurality of circuits, said surface being the surface of the top wiring layer of said stack;
   etching said TSV pattern through said stack, a cup shaped through hole being opened through said stack to said silicon substrate at each TSV pattern location, the etched said stack forming a TSV hard mask open (HMO) for said silicon substrate; and
   etching via through holes through said silicon substrate masked by said HMO.

2. The method of forming TSVs as in claim 1, wherein etching TSV pattern through said stack comprises plasma etching said stack.

3. The method of forming TSVs as in claim 2, wherein plasma etching comprises etching with nitrogen trifluoride ($NF_3$) as a primary etchant.

4. The method of forming TSVs as in claim 3, wherein the bottom of each said cup shaped through hole at least partially extends into said silicon wafer.

5. The method of forming TSVs as in claim 2, wherein etching said silicon substrate comprises etching with a Bosch etch.

6. The method of forming TSVs as in claim 5, wherein said Bosch etch scallops TSV sidewalls in silicon with Bosch scalloping below the etched HMO bottom, silicon sidewalls being smooth above said etched HMO bottom.

7. The method of forming TSVs as in claim 1, wherein etching with said silicon substrate masked by said HMO forms a sidewall discontinuity in each through hole where said HMO stops and etching said silicon substrate through said HMO begins.

8. The method of forming TSVs as in claim 1, further comprising filling the etched said via through holes with conductive material, TSVs being formed by said conductive material.

9. The method of forming TSVs as in claim 8, wherein each TSV connects one or more of said circuits to wiring below said silicon substrate.

10. A method of forming through silicon vias (TSVs) in integrated circuit (IC) chips, said method comprising:
- forming circuits on the surface of a silicon wafer;
- forming a stack of wiring layers above said surface, each wiring layer on a via layer, each via layer connecting to a layer below, a wiring layer dielectric in said each wiring layer separating wires from each other and a via layer dielectric in said each via layer separating vias from each other;
- forming a through silicon via (TSV) pattern on said stack, said TSV pattern identifying a plurality of TSV locations;
- etching a cup shaped open through said stack of wiring layers in each TSV location such that the bottom of each said cup shaped open at least partially extends into said silicon wafer, the etched said stack forming a TSV hard mask open (HMO) for said silicon wafer;
- etching via through holes through said silicon wafer masked by said HMO, TSV through holes being defined by said HMO and said via through holes; and
- filling said TSV through holes with conductive material, TSVs being formed by said conductive material.

11. The method of forming TSVs as in claim 10, wherein the via layer in said stack beneath the bottom wiring layer connects to said circuits.

12. The method of forming TSVs as in claim 10, wherein etching cup shaped opens comprises plasma etching said stack.

13. The method of forming TSVs as in claim 12, wherein plasma etching comprises etching with nitrogen trifluoride ($NF_3$) as a primary etchant.

14. The method of forming TSVs as in claim 12, wherein etching said via through holes through said silicon wafer comprises a Bosch etch.

15. The method of forming TSVs as in claim 14, wherein etching said via through holes forms scalloped silicon walls in said TSV through holes scalloped with Bosch scalloping below the etched HMO bottom, silicon sidewalls above said etched HMO bottom being smooth.

16. The method of forming TSVs as in claim 10, wherein etching with said via through holes forms a sidewall discontinuity wherein the cup shaped opens to said silicon wafer.

17. The method of forming TSVs as in claim 10, wherein one or more said TSVs connects one or more of said circuits to wiring below said silicon wafer.

* * * * *